United States Patent
Zhu et al.

(10) Patent No.: US 7,423,303 B2
(45) Date of Patent: Sep. 9, 2008

(54) STRAINED SILICON DIRECTLY-ON-INSULATOR SUBSTRATE WITH HYBRID CRYSTALLINE ORIENTATION AND DIFFERENT STRESS LEVELS

(75) Inventors: Huilong Zhu, Poughkeepsie, NY (US); Bruce B. Doris, Brewster, NY (US); Huajie Chen, Danbury, CT (US); Patricia M. Mooney, Mount Kisco, NY (US); Stephen W. Bedell, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/830,464

(22) Filed: Jul. 30, 2007

(65) Prior Publication Data

US 2007/0262361 A1 Nov. 15, 2007

Related U.S. Application Data

(62) Division of application No. 11/037,622, filed on Jan. 18, 2005, now Pat. No. 7,271,043.

(51) Int. Cl.
H01L 29/786 (2006.01)
(52) U.S. Cl. .............. 257/255; 257/353; 257/627; 257/E27.064; 438/199; 438/198
(58) Field of Classification Search .......... 257/E27.064, 257/255, 353, 627; 438/198–199
See application file for complete search history.

(56) References Cited

U.S. PATENT DOCUMENTS

| | | | |
|---|---|---|---|
| 6,194,255 B1 | 2/2001 | Hiroki et al. | |
| 6,399,970 B2 * | 6/2002 | Kubo et al. | 257/194 |
| 6,870,226 B2 * | 3/2005 | Maeda et al. | 257/347 |
| 7,094,634 B2 | 8/2006 | Zhu et al. | |
| 7,223,994 B2 * | 5/2007 | Chidambarrao et al. | 257/18 |
| 7,271,442 B2 * | 9/2007 | Yang et al. | 257/338 |
| 2003/0057439 A1 * | 3/2003 | Fitzgerald | 257/192 |
| 2003/0227036 A1 * | 12/2003 | Sugiyama et al. | 257/288 |
| 2005/0158931 A1 * | 7/2005 | Chen et al. | 438/191 |
| 2006/0003554 A1 | 1/2006 | Zhu et al. | |
| 2006/0049460 A1 * | 3/2006 | Chen et al. | 257/347 |
| 2006/0060925 A1 | 3/2006 | Doris et al. | |
| 2006/0063320 A1 * | 3/2006 | Orlowski et al. | 438/199 |
| 2006/0145264 A1 * | 7/2006 | Chidambarrao et al. | 257/369 |
| 2006/0172495 A1 | 8/2006 | Zhu et al. | |
| 2006/0194384 A1 * | 8/2006 | Venkatesan et al. | 438/202 |
| 2006/0237790 A1 | 10/2006 | Zhu et al. | |
| 2007/0099367 A1 * | 5/2007 | Chan et al. | 438/198 |

* cited by examiner

*Primary Examiner*—Jerome Jackson
*Assistant Examiner*—Paul A Budd
(74) *Attorney, Agent, or Firm*—Scully, Scott, Murphy & Presser, P.C.; Ido Tuchman, Esq.

(57) ABSTRACT

The present invention provides a strained Si directly on insulator (SSDOI) substrate having multiple crystallographic orientations and a method of forming thereof. Broadly, but in specific terms, the inventive SSDOI substrate includes a substrate; an insulating layer atop the substrate; and a semiconducting layer positioned atop and in direct contact with the insulating layer, the semiconducting layer comprising a first strained Si region and a second strained Si region; wherein the first strained Si region has a crystallographic orientation different from the second strained Si region and the first strained Si region has a crystallographic orientation the same or different from the second strained Si region. The strained level of the first strained Si region is different from that of the second strained Si region.

9 Claims, 10 Drawing Sheets

US 7,423,303 B2

STRAINED SILICON DIRECTLY-ON-INSULATOR SUBSTRATE WITH HYBRID CRYSTALLINE ORIENTATION AND DIFFERENT STRESS LEVELS

RELATED APPLICATION

This application is a divisional application of U.S. Ser. No. 11/037,622, filed Jan. 18, 2005, now U.S. Pat. No. 7,271,043.

This application is related to co-assigned U.S. patent application Ser. No. 10/250,241 entitled "HIGH PERFORMANCE SOI DEVICES ON HYBRID CRYSTAL-ORIENTATED SUBSTRATES," filed Jun. 17, 2003, now U.S. Patent Application Publication No. 2004/0256700, published Dec. 23, 2004, and co-assigned U.S. patent application Ser. No. 10/710,277 entitled "STRUCTURE AND METHOD FOR MANUFACTURING PLANAR SOI SUBSTRATE WITH MULTIPLE ORIENTATIONS," filed Jun. 30, 2004, now U.S. Pat. No. 7,094,634 issued Aug. 22, 2006, the entire content and subject matter of which are incorporated herein by reference. The application is also related to co-assigned U.S. patent application Ser. No. 10/905,978 (SSMP 17468) entitled "STRUCTURE AND METHOD FOR MANUFACTURING PLANAR STRAINED Si/SiGe SUBSTRATE WITH MULTIPLE ORIENTATIONS AND DIFFERENT STRESS LEVEL," filed Jan. 28, 2005, now U.S. Pat. No. 7,220,626, issued May 22, 2007, the entire content and subject matter of which are incorporated herein by reference.

FIELD OF THE INVENTION

The present invention relates to semiconductor materials having enhanced electron and hole mobilities, and more particularly, to semiconductor materials that include a silicon (Si)-containing layer having enhanced electron and hole mobilities. The present invention also provides methods for forming strained semiconductor materials directly on insulating layers (SSDOI).

BACKGROUND OF THE INVENTION

For more than three decades, the continued miniaturization of silicon metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. A concise summary of near-term and long-term challenges to continued CMOS scaling can be found in the "Grand Challenges" section of the 2002 Update of the International Technology Roadmap for Semiconductors (ITRS). A very thorough review of the device, material, circuit, and systems can be found in Proc. IEEE, Vol. 89, No. 3, March 2001, a special issue dedicated to the limits of semiconductor technology.

Since it has become increasingly difficult to improve MOSFETs and therefore complementary metal oxide semiconductor (CMOS) performance through continued scaling, methods for improving performance without scaling have become critical. One approach for doing this is to increase carrier (electron and/or hole) mobilities. This can be done by either: (1) introducing the appropriate strain into the Si lattice; (2) by building MOSFETs on Si surfaces that are orientated in directions different than the conventional <100> Si; or (3) a combination of (1) and (2).

As far as approach (1) is concerned, the application of stresses or strains changes the lattice dimensions of the Si-containing layer. By changing the lattice dimensions, the energy band gap of the material is changed as well. The change of effective mass and band structure due to stress enhances or reduces electron and/or hole mobility.

N-type channel field effect transistors (nFETs) need tension on the channel for strain-based device improvements, while p-type channel field effect transistors (pFETs) need a compressive force on the channel for strain-based device improvements.

In terms of approach (2), electrons are known to have a high mobility for a (100) Si surface orientation, but holes are known to have high mobility for a (110) surface orientation. That is, hole mobility values on (100) Si are roughly 2× lower than the corresponding electron hole mobility for this crystallographic orientation. To compensate for this discrepancy, pFETs are typically designed with larger widths in order to balance pull-up currents against the nFET pull-down currents and achieve uniform circuit switching. nFETs having larger widths are undesirable since they take up a significant amount of chip area.

On the other hand, hole mobilities on the (110) crystal plane of Si are approximately 2× higher than on the (100) crystal plane of Si; therefore, pFETs formed on a surface having a (110) crystal plane will exhibit significantly higher drive currents than pFETs formed on a surface having a (100) crystal plane. Unfortunately, electron mobilities on the (110) crystal plane of Si are significantly degraded compared to the (100) crystal plane of Si.

There is interest in integrating strained silicon having multiple crystallographic orientations with silicon directly on insulator (SDOI) technology. SDOI substrates reduce parasitic capacitance within the integrated circuit, reduce individual circuit loads and reduce the incidence of latch-up, thereby improving circuit and chip performance.

In view of the state of the art mentioned above, there is a continued need for providing a strained Si directly on insulator (SSDOI) substrates with multiple crystallographic orientations and with the same or different stress levels.

SUMMARY OF THE INVENTION

One object of the present invention is to provide a multiple crystallographic orientation strained Si directly on insulator (SSDOI) substrate.

Another object of the present invention is to provide a SSDOI substrate that integrates strained silicon nFETs on a (100) crystal plane with strained silicon pFETs on a (110) crystal plane.

These and other objects and advantages are achieved in the present invention by utilizing a method that provides a multiple orientation SSDOI substrate including bonding, masking, etching and epitaxial regrowth process steps. Specifically, the method of the present invention comprises the steps of:

providing a layered structure comprising a first substrate and a multiple orientation surface layer separated by a layer of a first lattice dimension material, said multiple orientation surface layer comprising a first region and a second region, said first region including a first strained semiconducting layer separated from said layer of said first lattice dimension material by a regrown portion of said first lattice dimension material, said second region comprising a second strained semiconducting layer atop a second lattice dimension material and separated from said layer of said first lattice dimension material and said first region by a dielectric material;

forming an insulating material on said multiple orientation surface layer;

bonding a second substrate to said insulating material; and removing said first substrate, said layer of said first lattice dimension material, said regrown portion of said first lattice dimension material, said second lattice dimension material in said second region, said first lattice dimension material in said first region and a portion of said dielectric material to expose a surface of said first strained semiconducting layer and said second strained semiconducting layer, wherein said first strained semiconducting layer has a crystallographic orientation different from said second strained semiconducting layer and an internal stress the same or different from said second strained semiconducting layer.

In accordance with the present invention, the layered structure may be provided by first providing a bonded structure comprising a layer of second lattice dimension material atop a layer of dielectric material, wherein the layer of dielectric material is atop a layer of the first lattice dimension material, wherein the first lattice dimension material is bonded to the first substrate. The first lattice dimension material has a different crystallographic orientation than the second lattice dimension material.

Conventional layer transfer and thermal bonding methods may provide the bonded structure. The layer of first lattice dimension material is formed by depositing a first lattice modifying material atop a first crystallographic orientation material, in which during subsequent annealing thermal mixing of the first lattice modifying material with the first crystallographic orientation material forms the first lattice dimension material. The layer of second lattice dimension material is formed by depositing a second lattice modifying material atop a second crystallographic orientation material, in which during subsequent annealing thermal mixing of the second lattice modifying material with the second crystallographic orientation material form the second lattice dimension material. The deposition process described above is an epitaxial growth of SiGe, wherein the Ge concentration controls the lattice dimension of the deposited layer. The lattice dimension mentioned herein refers to the in-plane lattice dimension unless otherwise specified.

In a next process step, a portion of the bonded structure is protected, while another portion of the bonded structure is etched to expose a surface of the first lattice dimension material. A remaining portion of the second orientation material and the dielectric material are positioned within the second device region.

Spacers are then formed adjacent to the second region and a regrown portion of first lattice dimension material is formed on the exposed surface of the layer of the first lattice dimension material within the first region. The upper surface of the regrown portion of the first lattice dimension material is then processed to be substantially coplanar with the upper surface of the second lattice dimension material in the second region.

In a next process step, a first strained semiconducting layer is epitaxially grown atop the first lattice dimension material and a second strained semiconducting layer is epitaxially grown atop the second lattice dimension material to provide the multiple orientation surface layer comprising a first strained semiconducting layer in the first region and a second strained semiconducting layer in the second region. The first strained semiconducting material and the second strained semiconducting material can have the same or a different thickness, wherein each strained semiconducting layer may be independently processed using block masks.

An insulating layer is then formed atop the multiple orientation surface layer by depositing an oxide using conventional deposition methods. The insulating layer is then planarized to provide a planar surface for thermal bonding by chemical mechanical polishing (CMP) or like planarization processes.

A second substrate is then bonded to the insulating layer using thermal bonding. The first and second strained semiconducting layers are exposed by removing at least the first substrate, the layer of dielectric material, the first lattice dimension material, and the second lattice dimension material. The resultant structure is a strained Si directly on insulator (SSDOI) substrate having multiple orientations, wherein each region of the SSDOI substrate may have a crystallographic orientation and strain that is optimized for pFET and/or nFET devices.

In another embodiment of the present invention, a method is provided for producing a multiple orientation SSDOI substrate in which the initial structure utilized in the method does not include a layer of the first lattice dimension material separating the multiple orientation surface layer and the first substrate, as described with reference to the previous embodiment. Broadly, this embodiment of the inventive method comprises:

providing a layered structure comprising a first substrate bonded to a multiple orientation surface layer through a layer of a dielectric material, said multiple orientation surface layer having a first region and a second region, said first region comprising a first strained semiconducting layer positioned on a first lattice dimension material and said second device region comprising a second strained semiconducting layer on a second lattice dimension material, wherein said first region and said second region are separated by spacers;

forming a layer of an insulating material on said multiple orientation surface layer;

bonding a second substrate to said layer of said insulating material; and removing at least said first substrate, said layer of dielectric material, said first lattice dimension material, and said second lattice dimension material to expose a surface of said first strained layer and said second strained layer, wherein said first strained semiconducting layer has a crystallographic orientation and internal stress different from said second strained semiconducting layer.

In this embodiment, the first lattice dimension material and second lattice dimension material may be formed on a single substrate prior to using a layer transfer method.

In accordance with the present invention, the initial process steps for providing the layered structure begins with providing a bonded structure including a first orientation material substrate, a layer of dielectric material atop the first orientation material substrate, a planarization stop layer atop the layer of dielectric material, and a layer of a second orientation material atop the planarization stop layer.

A portion of the bonded structure is then protected, while leaving an exposed portion of the bonded structure unprotected, wherein the exposed portion of the bonded structure is etched to expose a surface of the first orientation material substrate. Insulating material spacers are then formed around the remaining portions of the layer of second orientation material and the dielectric material, thus defining the second region. First orientation material is then regrown on the exposed surface of the first orientation substrate in defining the first region. In a next process step, a damaged interface is produced in the first orientation material substrate and a first substrate is thermally bonded to the upper surface of the second orientation material. During bonding, the first orientation material substrate is separated about the damaged interface.

The first orientation material in the first region and the second orientation material in said second region are then exposed by a selective etch process that removes the remaining portion of the first orientation material substrate. A first concentration of lattice modifying material is then thermally mixed with the first orientation material to form a first lattice dimension surface and a second concentration of lattice modifying material is thermally mixed with a second orientation material to provide a second lattice dimension surface.

Finally, a first strained semiconducting layer is epitaxially grown atop the first lattice dimension surface and a second strained semiconducting layer is epitaxially grown atop the second lattice dimension surface to provide the multiple orientation surface layer having a first strained semiconducting layer positioned on a first lattice dimension material and a second strained semiconducting layer on a second lattice dimension material.

Another aspect of the present invention is an inventive multiple orientation SSDOI substrate formed by the above methods. Broadly the inventive structure comprises:

a substrate;

an insulating layer atop said substrate; and a semiconducting layer positioned atop and in direct contact with said insulating layer, said semiconducting layer comprising a first strained Si region and a second strained Si region; wherein said first strained Si region has a crystallographic orientation different from said second strained Si region.

In accordance with the present invention, the first strained semiconducting layer further comprises at least one pFET device and the second strained semiconducting layer further comprises at least one nFET device, when the first crystallographic orientation has a (110) crystal plane, the second crystallographic orientation has a (100) crystal plane. In one embodiment of the present invention, the first strained semiconducting layer has a higher internal stress than the second strained semiconducting layer, wherein pFET devices are preferably formed in the first region and nFET devices are formed in the second region.

DETAILED DESCRIPTION OF THE INVENTION

Figure 1:
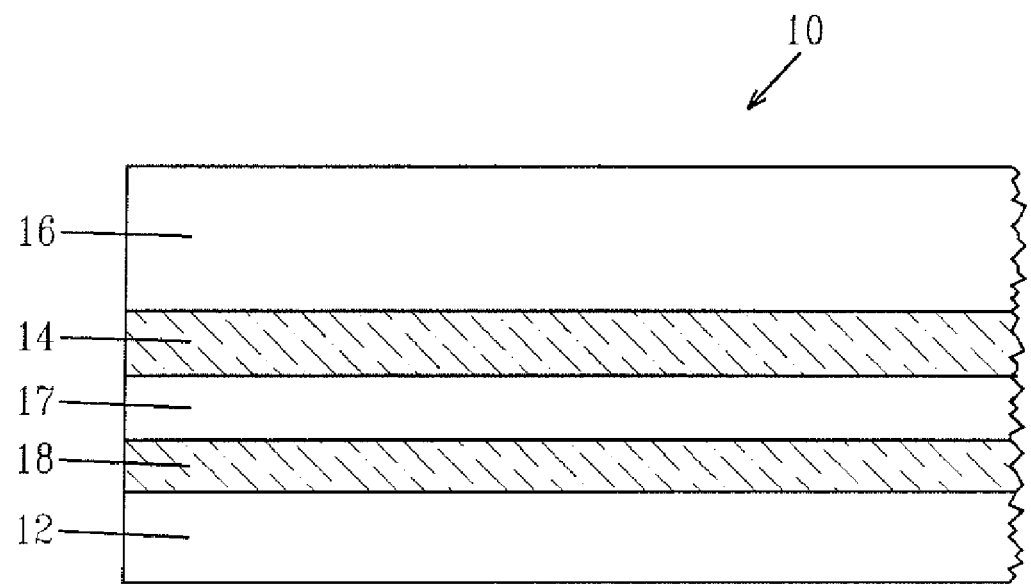
FIGS. 1-7 are pictorial representations (through cross sectional views) illustrating the basic processing steps utilized in one embodiment of the present invention to form a SSDOI substrate having multiple crystallographic orientation planes.

The present invention, which provides a method of forming an SSDOI substrate having different crystallographic surfaces, will now be described in greater detail by referring to the following discussion as well as the drawings that accompany the present application. In the accompanying drawings, like and correspondence elements are referred to by like reference numerals.

The first embodiment of the present invention is now described with reference to FIGS. 1-7. This embodiment provides a SSDOI substrate comprising regions separated by insulating material, in which each region has a crystallographic orientation and an internal stress that can be optimized for a specific type of semiconducting device. For example, the following method can provide a first region having a crystallographic orientation and an internal stress that is optimized for nFET devices and a second device having a crystallographic orientation and an internal stress that is optimized for pFET devices.

Reference is first made to the initial structure shown in FIG. 1, in which a bonded substrate 10, i.e., hybrid substrate, is depicted. As shown, bonded substrate 10 includes a layer of a second lattice dimension material layer 16, a layer of dielectric material 14, a layer of a first lattice dimension material 17, a first oxide layer 18 and a first substrate 12.

The second lattice dimension layer 16 preferably comprises SiGe. The second lattice dimension layer 16 typically has a Ge concentration ranging from about 20% to about 40%, where the concentration of Ge is selected to produce the appropriate stress within the subsequently formed second strained semiconducting layer for a pFET device. The Ge concentration is expressed in atomic number %. Alternatively, the second lattice dimension layer 16 is grown having a Ge concentration ranging about 5% to about 30%, where the concentration of Ge is selected to produce the appropriate strain within the subsequently formed second semiconducting layer for an nFET device. Alternatively, the second lattice dimension layer 16 may comprise any material that can produce an intrinsic strain in a subsequently formed epitaxial Si, such as Si doped with carbon.

The second lattice dimension material layer 16 has a second crystallographic orientation, preferably a (110) crystal plane. Although a (110) crystal plane is preferred, the second lattice dimension material layer 16 may alternatively have a first crystallographic orientation having a (111) crystal plane, (100) crystal plane or other crystal planes.

The layer of dielectric material 14 that is located between the second lattice dimension material layer 16 and the first lattice dimension material layer 17 is preferably an oxide, such as SiO$_2$, and has a variable thickness depending upon the initial wafers used to create the bonded substrate 10. Typically, however, the layer of dielectric material 14 has a thickness from about 10 nm to about 500 nm, with a thickness from about 20 nm to about 100 nm being more highly preferred.

The first lattice dimension material layer 17 preferably comprises SiGe. The first lattice dimension material layer 17 typically has a Ge concentration ranging from about 5% to about 30%, where the concentration of Ge is selected to produce the appropriate stress within the subsequently formed first strained semiconducting layer for an nFET device. Alternatively, the first lattice dimension material layer 17 is grown having a Ge concentration ranging about 20% to about 40%, where the concentration of Ge is selected to produce the appropriate strain within the subsequently formed second semiconducting layer for a pFET device. Alternatively, the first lattice dimension layer 17 may comprise any material that can produce an intrinsic strain in a subsequently formed epitaxial Si, such as Si doped with carbon.

The first lattice dimension material layer 17 has a first crystallographic orientation, which is different from the second lattice dimension material layer 16. Since, the second lattice dimension material layer 16 is preferably a surface having a (110) crystal plane, the first lattice dimension material has a (100) crystal plane. Although a (100) crystal plane is preferred, the first lattice dimension layer 17 may alternatively have a first crystallographic orientation having a (111) crystal plane, (110) crystal plane, or other crystal planes.

The bonded substrate 10 may be formed using conventional thermal bonding methods. Specifically, a first SOI wafer and a second SOI wafer are first provided. The first SOI wafer comprises a first orientation material atop a first oxide layer 18, wherein the first oxide layer 18 is atop a first substrate 12. The second SOI wafer comprises a second orientation material atop a handling wafer. The first and second orientation material may comprise a Si-containing material, wherein the crystallographic orientation of the first orientation material is different from the crystalline orientation of the second orientation material. Alternatively, the crystallographic orientation of the first orientation material is the same as the crystalline orientation of the second orientation material.

A first concentration of lattice modifying material is then formed atop the first orientation material and a second concentration of lattice modifying material is formed atop the second orientation material. The first concentration and second concentration of lattice modifying material may be SiGe formed by epitaxial growth. The first concentration of lattice modifying material may be SiGe having a Ge concentration ranging from 5% to about 30%. The second concentration of lattice modifying material may be SiGe having a Ge concentration ranging from 20% to about 40%.

The first and second substrates are then annealed using a thermal process, such as rapid thermal anneal (RTA) or furnace annealing, preferably being a high temperature oxidation at a temperature greater than 1200° C. During annealing the first concentration of lattice modifying material intermixes with the first orientation material to provide a first lattice dimension material layer 17 and the second lattice concentration of lattice modifying material intermixes with the second orientation material to provide a second lattice dimension material layer 16. The crystallographic orientation of the first orientation material is maintained in the first lattice dimension material and the crystallographic orientation of the second orientation material is maintained in the second lattice dimension material. Preferably, the first lattice dimension material produces an internal strain in the subsequently formed first strained semiconducting layer for increased carrier mobility in nFET devices. Preferably, the second lattice dimension material produces an internal strain in the subsequently formed second strained semiconducting layer for increased carrier mobility in pFET devices.

During annealing, a thermal oxide layer is formed atop the first lattice dimension material 17 and the second lattice dimension material 16 and relaxation occurs (assuming that these materials are metastable, i.e., that the thickness exceeds the critical thickness for strain relaxation at high temperature annealing).

Following annealing, a hydrogen implantation into the second substrate produces a damaged interface in the handling wafer. The hydrogen ions may be implanted by conventional ion implantation using a dosage ranging from about $1 \times 10^{16}$ atoms/cm$^2$ to about $2 \times 10^{17}$ atoms/cm$^2$. The hydrogen atoms may be implanted using an implantation energy ranging from about 50 keV to about 150 keV.

The thermal oxide atop the surface of each of the first and second substrates is then removed by an etch process selective to and exposing the first and second lattice dimension material layer 17, 16. In a next process step, the exposed surface of the second lattice dimension material 16 of the second substrate is thermally bonded to the first substrate through the layer of dielectric material 14. The first handling wafer is then separated about the damaged interface, wherein the greater portion of the first handling wafer is discarded and a remaining portion of the first handling wafer is removed by a selective etch, providing the bonded substrate depicted in FIG. 1.

In a next process step, an etch mask is formed on a predetermined portion of the second lattice dimension material layer 16, so as to protect a portion of the bonded substrate 10, while leaving another portion of the bonded substrate 10 unprotected. The etch mask may comprise a photoresist or be a single or multi-layer dielectric hardmask. The unprotected portion of the bonded substrate 10 defines a first area 24 of the structure, whereas the protected portion of the bonded substrate 10 defines a second region 22. After providing the etch mask, the structure is subjected to one or more etching steps to expose a surface of the first lattice dimension layer 17. Specifically, the one or more etching steps used at this point of the present invention removes the unprotected portions of the second lattice dimension material layer 16 and layer of dielectric material 14, stopping on the first lattice dimension material layer 17. The etching may include a dry etching process, such as reactive-ion etching, ion beam etching, plasma etching or laser etching. The etch mask is then removed.

In one embodiment, an etch stop layer 19 may be formed atop the second lattice dimension material layer 16 prior to defining the first and second device region 24, 22. The etch stop layer 19 preferably comprises a nitride, such as $Si_3N_4$. The etch stop layer 19 may be deposited by conventional methods, such as chemical vapor deposition, and can have a thickness ranging from about 5 nm to about 20 nm, with a thickness of about 10 nm being more typical.

Figure 2:
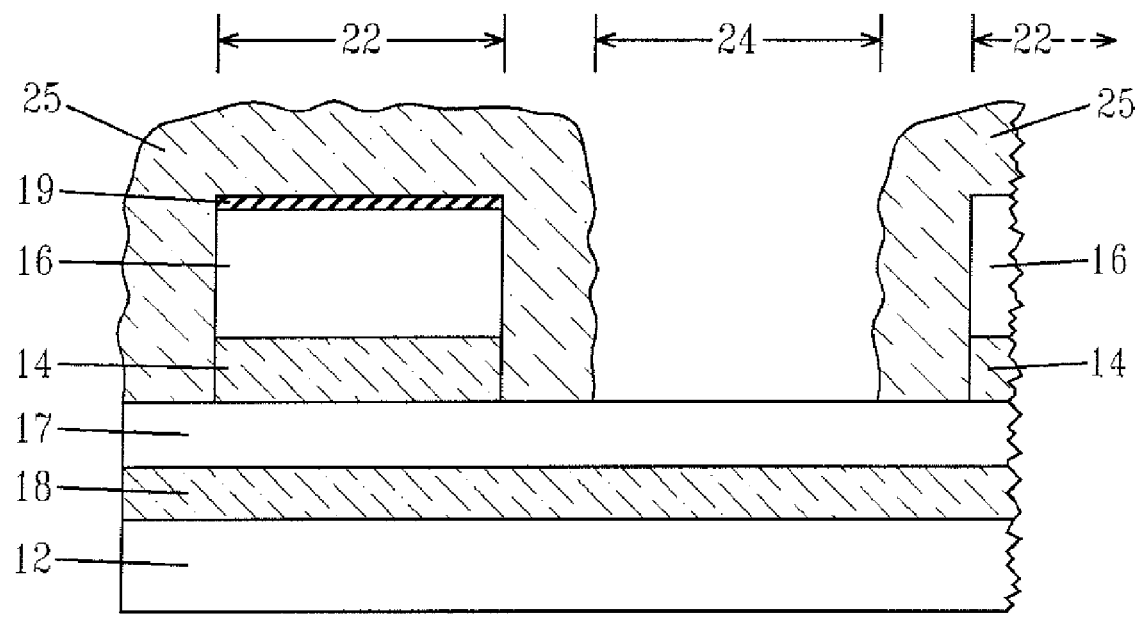

Insulating material spacers 25 are then formed atop and on the exposed sidewalls of the remaining portions of the second lattice dimension material layer 16 and the layer of dielectric material 14 in the second region 22, as depicted in FIG. 2. The insulating material spacers 25 are formed by deposition and etching and can be comprised of any insulator, such as, for example, an oxide.

Figure 3:
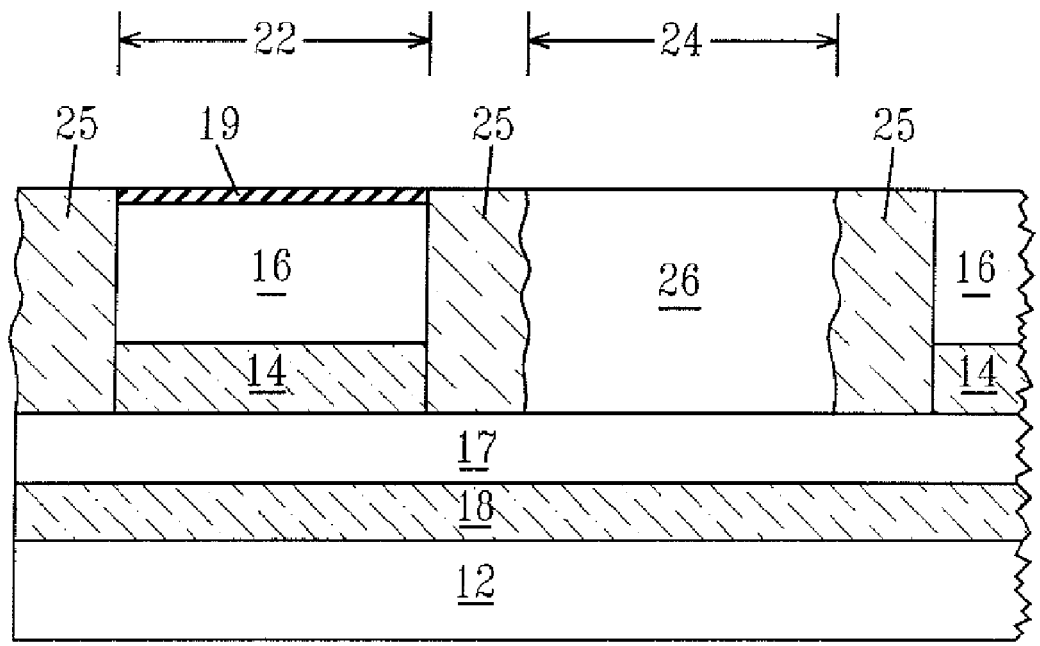

Referring to FIG. 3, a regrown portion of first lattice dimension material 26 is then epitaxially grown in the first region 24, on the exposed surface of the first lattice dimension material layer 17. In accordance with the present invention, regrown portion of first lattice dimension material 26 has a crystallographic orientation that is the same as the crystallographic orientation of the first lattice dimension material layer 17. Preferably, the crystallographic orientation of the regrown portion of first lattice dimension material 26 has a (100) crystal plane. Although a (100) crystal orientation is preferred, the regrown portion of first lattice dimension material 26 may alternatively have a (111) crystal plane, a (110) crystal plane or other crystal planes.

The regrown portion of first lattice dimension material 26 preferably comprises epitaxially grown SiGe. Alternatively, the regrown portion of first lattice dimension material layer 26 may comprise any material that can produce an intrinsic strain in subsequently formed epitaxial Si, such as Si doped with carbon, which is capable of being formed utilizing an epitaxial growth method.

A planarization process, such as chemical mechanical polishing (CMP) or grinding, planarizes the upper surface of the regrown portion of first lattice dimension material layer 26 to be substantially planar with the etch stop layer 19 atop the second lattice dimension material layer 16, as depicted in FIG. 3. This step is optional and need not be performed in all instances. An oxidation process then forms an oxide layer atop the regrown portion of first lattice dimension material 26. The oxide layer and etch stop layer 19 are then removed to using a selective etch process, wherein the upper surface of first lattice dimension material 26 in the first region 24 is substantially coplanar to the upper surface of the second lattice dimension material 16 in the second region 22.

Figure 4:
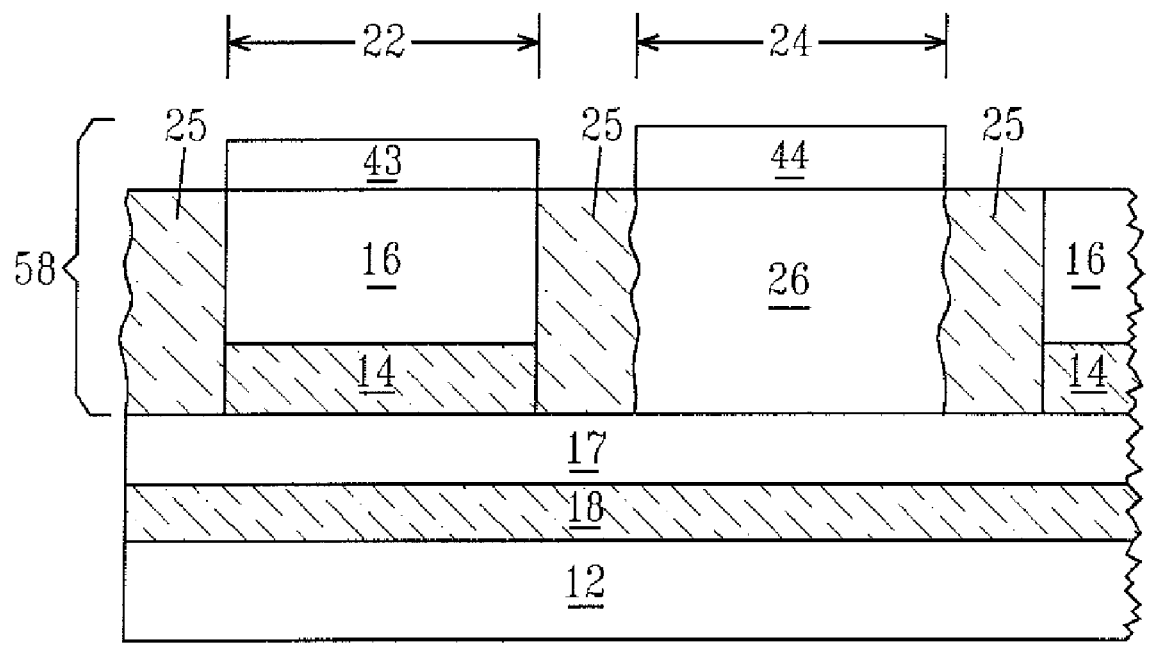

Referring to FIG. 4, in a next process step a first strained semiconducting layer 44 is formed atop the regrown portion of the first lattice dimension material 26 in the first region 24 and the second strained semiconducting layer 43 is formed atop the second lattice dimension material 12 in the second region 22. The first strained semiconducting layer 44 and the second strained semiconducting layer 43 preferably comprise Si grown by an epitaxial growth process. In a preferred embodiment, the first strained semiconducting layer 44 has an internal stress that provides increased carrier mobility in nFET devices, and the second strained semiconducting layer 43 has an internal stress that provides increased carrier mobility in pFET devices.

The first strained semiconducting layer 44 and the second strained semiconducting layer 43 may have the same or different thickness. The thickness of the first strained semiconducting layer 44 is not greater than its critical thickness. Typically, the first strained semiconducting layer has a thickness from about 10 nm to about 40 nm. The thickness of the second strained semiconducting layer 43 is not greater than its critical thickness. Typically, the second strained semiconductor layer 44 has a thickness from about 10 nm to about 40 nm.

In the embodiment in which the thickness of the first strained semiconducting layer 44 is different from the second strained semiconducting layer 43, a first protective layer is formed overlying the regrown portion of the first lattice dimension material 26 leaving said second lattice dimension material 16 exposed. The first protective layer may comprise a hardmask, such as an oxide or nitride. The first protective layer preferably comprises $Si_3N_4$ and has a thickness ranging from about 10 nm to about 20 nm. The first protective layer may be formed using conventional deposition, photolithography and etch processes.

The second strained semiconducting layer 43 is then grown atop the second lattice dimension material 16 by an epitaxially growth process. The second strained semiconducting layer 43 only grows on the exposed surface of the second lattice dimension material 16, since selective epitaxial growth requires a silicon-containing surface. The protective layer is then removed by etch or chemical strip.

A second protective layer, similar in composition to the first protective layer, can then be formed overlying the second strained semiconductor layer 43 leaving the first lattice dimension material 26 exposed. A first strained semiconducting layer 44 is then grown atop the first lattice dimension material 26 by an epitaxial growth process. Similar to the second semiconducting layer 43, the first semiconducting layer only grows atop silicon-containing surfaces. Following the formation of the first semiconducting layer 44, the second protective layer is removed by etch or chemical strip.

The surface of the first strained semiconducting layer 44 and the second strained semiconducting layer 43 having different crystalline orientations produce a multiple orientation surface layer 58 having a first region 24 and a second region 22, wherein the first region 24 comprises a first strained semiconducting layer 44 positioned on a first lattice dimension material 26 and said second region 22 comprises a second strained semiconducting layer 43 on a second lattice dimension material 16, as depicted in FIG. 4.

Figure 5:
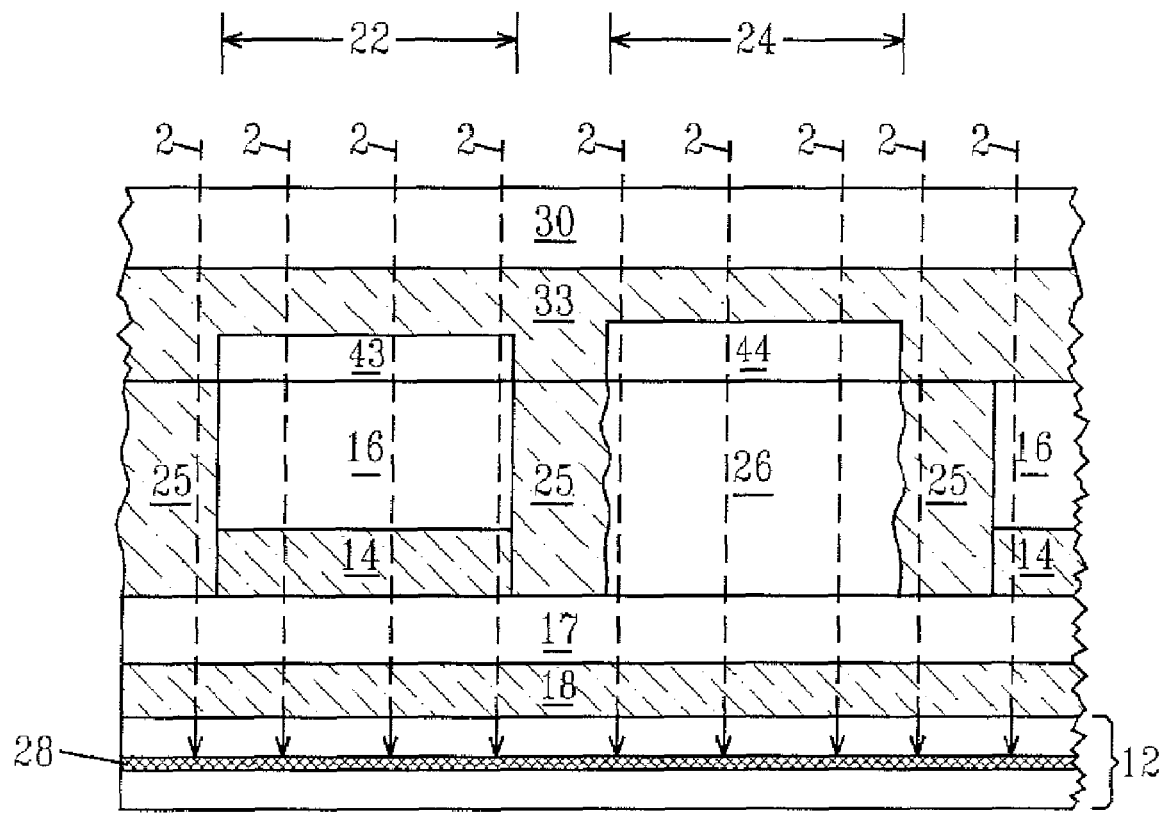

Referring to FIG. 5, in a next process step a planar bonding layer 33 is deposited atop the first strained semiconducting layer 44 (layer of insulating material) and the second strained semiconducting layer 43. The planar bonding layer 33 is formed using conventional deposition and planarization. Specifically, a layer of insulating material is formed using a conventional deposition process, such as chemical vapor deposition. The layer of insulating material is then planarized to produce the planar bonding layer 33 using a conventional planarization method, such as CMP. In a next process step, a damaged interface 28 is formed within the first substrate 12 by implanting hydrogen ions 2, or other like ions, into the first substrate 12. The hydrogen ions may be implanted by conventional ion implantation using a dosage ranging from about $1 \times 10^{16}$ atoms/cm$^2$ to about $2 \times 10^{17}$ atoms/cm$^2$.

Still referring to FIG. 5, a second substrate 30 is then bonded to the planar bonding layer 33 (layer of insulating material). Bonding is achieved by bringing the substrate 30 into intimate contact with the face of the planar bonding layer 33, optionally applying an external force to the contacted substrate 30 and planar bonding layer 33, and then heating the two contacted surfaces under conditions that are capable of bonding. The heating step may be performed in the presence or absence of an external force.

Figure 6:
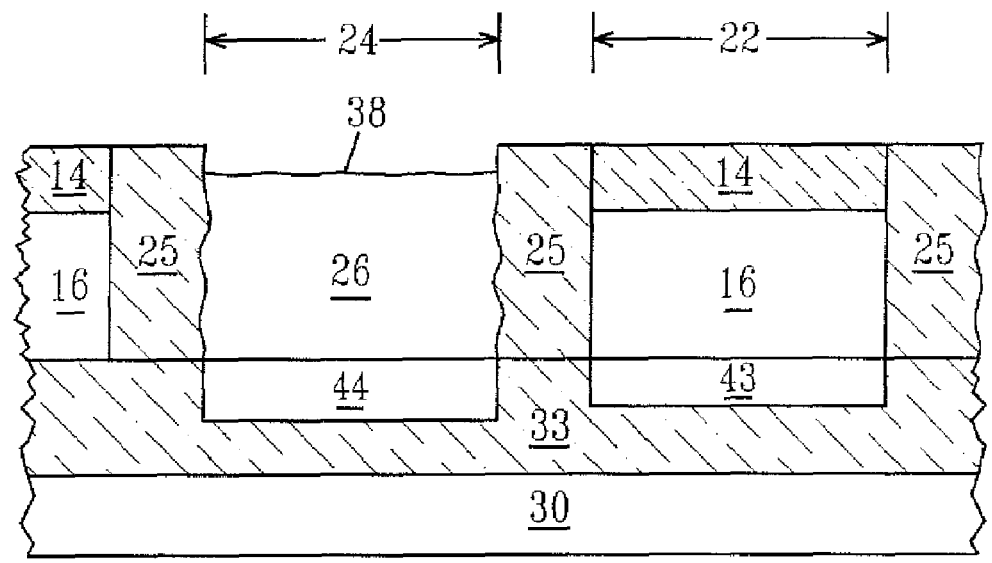

During bonding, the first substrate 12 separates about the damaged interface 28 of the first substrate 12, in which a portion of the first substrate 12 positioned below the damaged interface 28 is removed and a portion of the first substrate 12 above the damaged interface 28 remains. Following bonding, the structure may be rotated 180 degrees. The remaining portion of the first substrate 12 is then subjected to a planarization process, such as chemical mechanical polishing (CMP) or grinding. Following planarization, the first substrate 12, the first oxide layer 18, and first lattice dimension material layer 17 are removed by an etch process selective to the layer of dielectric material 14 and the insulating material spacers 25. During this etch, the surface 38 of the regrown portion of the first lattice dimension material 26 may be recessed. FIG. 6 depicts the resultant structure formed by the above planarization process.

Figure 7:
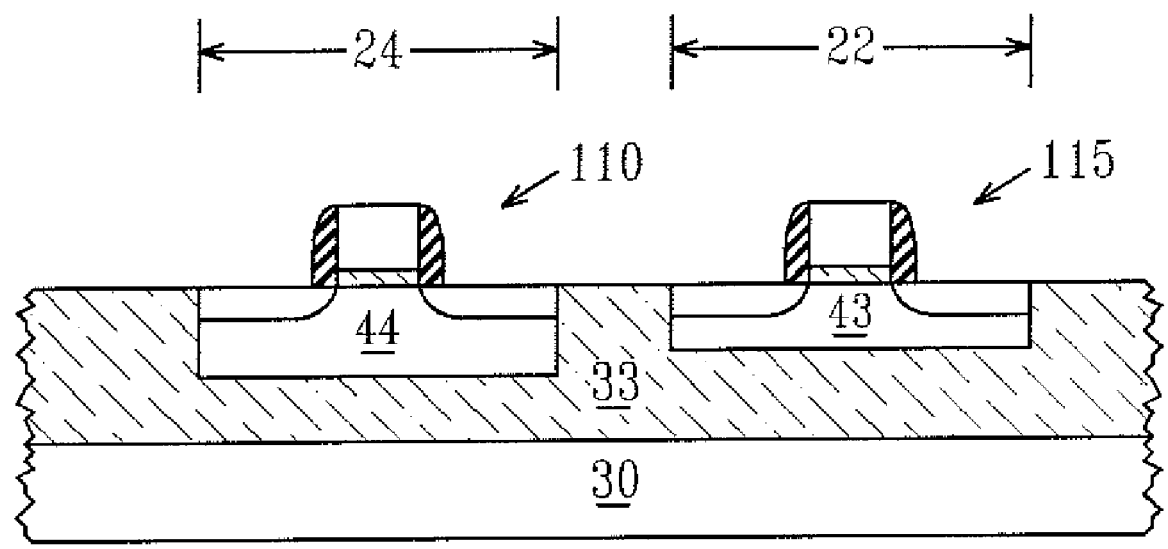

Referring to FIG. 7, in a next process step, the layer of dielectric material 14 is removed and the insulating material 25 is recessed by a timed etch process having selectivity to the regrown portion of the first lattice dimension material 26 and the second lattice dimension material 16. The etch process may include conventional etch process, such as reactive ion etch (RIE). The regrown portion of the first lattice dimension material 26 and the second lattice dimension material 16 are then removed to expose the first strained semiconducting layer 44 and the second strained semiconducting layer 43. The regrown portion of the first lattice dimension material 26 and the second lattice dimension material 16 may be removed using a high selective etch process, such as, reactive ion etch (RIE) having high etch selectivity to the first strained semiconducting layer 44, the second strained semiconducting layer 43, and the insulating material 25.

The exposed surfaces of the first strained semiconducting layer 44 and the second strained semiconducting layer 43 can then be processed to provide MOS devices. In a preferred embodiment, the first strained semiconducting layer 44 comprises at least one nFET device 110 and the second strained semiconducting layer 43 comprises at least one pFET device 115.

Another embodiment of the present invention is now described with reference to FIGS. 8-19. Similar to the previous embodiment of the invention, the embodiment of the present invention depicted in FIGS. 9-16 provides a multiple orientation SSDOI substrate comprising first and second regions separated by insulating material, in which each region has a crystallographic orientation and internal stress that is optimized for a specific type of semiconducting device. Similar to the previous embodiment depicted in FIGS. 1-7, this embodiment of the inventive method can provide a first region that is optimized for pFET devices and a second region that is optimized for nFET devices, or alternatively a first region optimized for nFETs and a second region optimized for pFETs.

Figure 8:
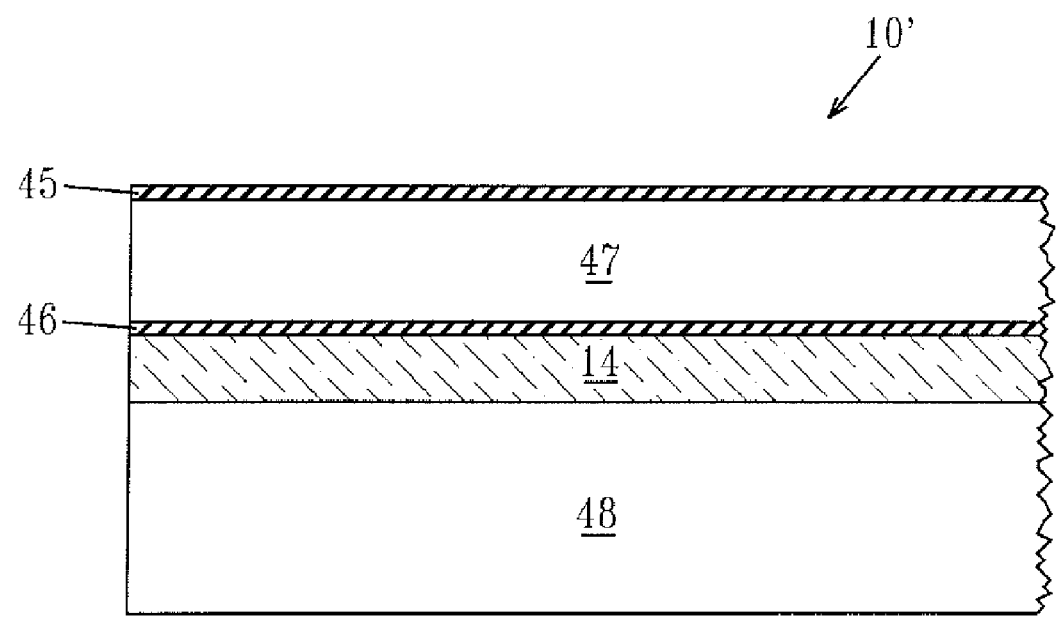
FIGS. 8-19 are pictorial representations (through cross sectional views) illustrating the basic processing steps utilized in another embodiment of the present invention to form a SSDOI substrate having multiple crystallographic orientation planes.

Reference is first made to the initial structure shown in FIG. 8. The initial structure comprises a bonded substrate 10' including a layer of a second orientation material 47, a second planarization stop layer 45, a layer of a dielectric material 14, a first planarization stop layer 46, and a first orientation material substrate 48.

The layer of second orientation material 47 is comprised of any semiconducting material including, for example, Si, SiC, SiGe, SiGeC, Ge alloys, GaAs, InAs, InP as well as other III/V or II/VI compound semiconductors. The thickness of the layer of second orientation material 47 may vary depending on the initial starting wafers used to form the bonded substrate 10'. Typically, however, the layer of second orientation material 47 has a thickness from about 5 nm to about 500 nm, with a thickness from about 5 nm to about 100 nm being more highly preferred.

The layer of second orientation material 47 typically has a crystallographic orientation in a (110) crystal plane and the first orientation material substrate 48 has a crystallographic orientation that is preferably a (100) crystal plane. The layer of second orientation material 47 may alternatively have a (111) crystal plane, a (100) crystal plane or other crystal planes and the first orientation material substrate 48 may alternatively have a (111) crystal plane, a (110) crystal plane or other crystal planes.

The first orientation material substrate 48 is comprised of any semiconducting material which may be the same or different from that of the layer of a second orientation material 47. Thus, first orientation material substrate 48 may include, for example, Si, SiC, SiGe, SiGeC, Ge alloys, GaAs, InAs, InP as well as other III/V or II/VT compound semiconductors. The first orientation material substrate 48 has a crystallographic orientation that is different from the layer of second orientation material 47. Since the layer of second orientation material 47 is preferably a surface having a (100) crystal plane, the first orientation material substrate 48 has a crystallographic orientation having a (110) crystal plane or other crystal planes. Although the first orientation material substrate 48 preferably has a (110) crystal plane, the substrate may alternatively have a (111) crystal plane, a (100) crystal plane or other crystal planes.

The layer of dielectric material 14 is preferably an oxide, such as $SiO_2$. The thickness of the layer of dielectric material 14 typically ranges from about 20 nm to about 50 nm. The first planarization stop layer 45 and the second planarization stop layer 46 have a thickness ranging from about 5 nm to about 20 nm, with a thickness of about 10 nm being more typical. The first planarization stop layer 45 and the second planarization stop layer 46 preferably comprise a nitride or oxynitride material, most preferably being $Si_3N_4$.

The bonded substrate 10' can be formed by thermally bonding the layer of second orientation material 47 and the first orientation material substrate 48 through the insulating layers positioned there between, such as the second planarization stop layer 46, the first planarization stop layer 45, and the layer of dielectric material 14. For example, the first planarization stop layer 45 is deposited on the layer of second orientation material 47 and the layer of dielectric material 14 is deposited on the second planarization stop layer 46 that is positioned on the surface of the first orientation material substrate 48. The etch stop layer 45 is then contacted with the first insulating layer 14 under thermal conditions sufficient to create bonding between the first planarization stop layer 45 and the layer of dielectric material 14. During the thermal bonding process, the layer of second orientation material 47 is supported by a handling wafer that is removed following bonding.

Figure 9:
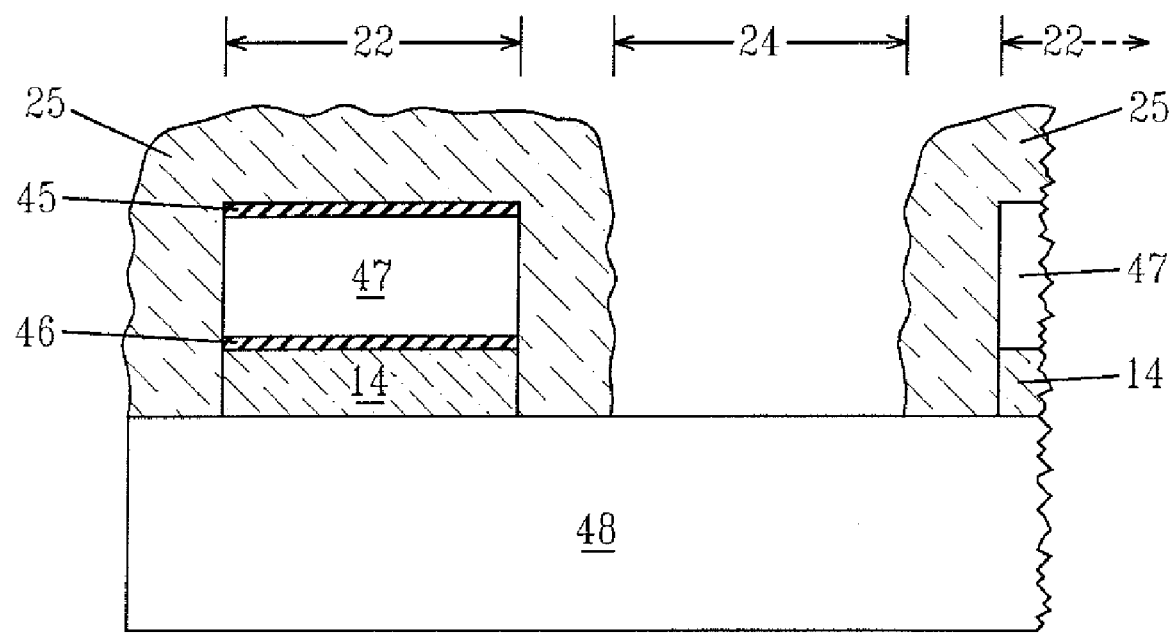

Referring to FIG. 9, the bonded substrate 10' is then patterned to provide a first region 24 and a second region 22. An etch mask is formed using conventional photoresist deposition and photolithography processing on a predetermined portion of the first planarization stop layer 45, so as to protect a portion of the first planarization stop layer 45 and the underlying bonding substrate 10', while leaving another portion of the first planarization stop layer 45 and the bonded substrate 10' unprotected. The unprotected portion of the bonded substrate 10' defines a first region 24 of the structure, whereas the protected portion of the bonded substrate 10' defines a second region 22. After providing the etch mask, the structure is subjected to one or more etching steps, so as to expose a surface of the first orientation material substrate 48. The etch mask is then removed utilizing a conventional resist stripping process.

In a next process step, an insulating material 25 is then formed atop, and on, the exposed sidewalls of the remaining portions of the first planarization stop layer 45, the layer of second orientation material 47, the second planarization stop layer 46 and the layer of dielectric material 14 in the second region 22.

Figure 10:
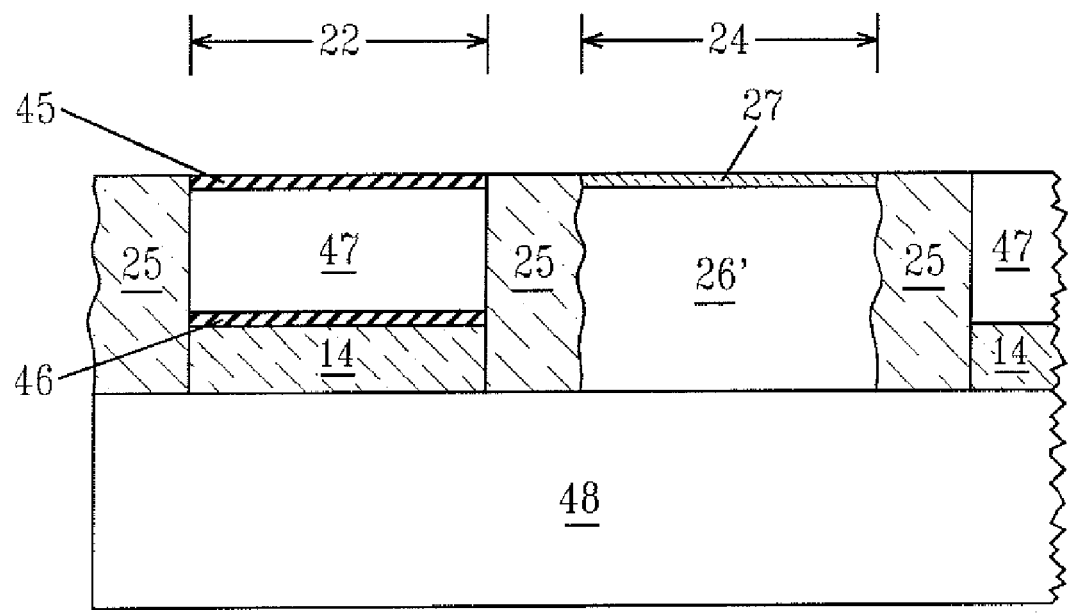

Referring to FIG. 10, a regrown portion of first orientation material 26' is then epitaxially grown in the first region 24, on the exposed surface of the first orientation material substrate 12. In accordance with the present invention, the regrown material 26' has a crystallographic orientation that is the same as the crystallographic orientation of the first orientation material substrate 48. In the present embodiment, the regrown portion of first orientation material 26' preferably comprises a crystallographic orientation having a (110) crystal plane.

Still referring to FIG. 10, a planarization process, such as chemical mechanical polishing (CMP) or grinding, is then conducted such that the upper surface of the regrown portion of first orientation material 26' is substantially planar with the upper surface of the first planarization stop layer 45.

An oxidation layer 27 is then formed atop the regrown portion of first orientation material 26' so that the first region 24 has a surface substantially coplanar to the first planarization stop layer 45. The oxidation layer is formed by a thermal oxidation of Si process (local oxidation of silicon (LOCOS)) and can have a thickness ranging from about 10 nm to about 15 nm. Similar to the damaged interface 28 formed in the previous embodiment depicted in FIG. 5, a damaged interface is then formed within the first orientation material substrate 48.

In a next process step, the upper surface of the structure depicted in FIG. 10, including the first planarization stop layer 45 and the oxidation layer 27, are processed to provide a planar surface for wafer bonding. Prior to bonding, the first planarization stop layer 45 can be removed using a high selectivity etch process, without substantially etching the layer of second orientation material 47, insulating material 25, and oxidation layer 27.

Figure 11:
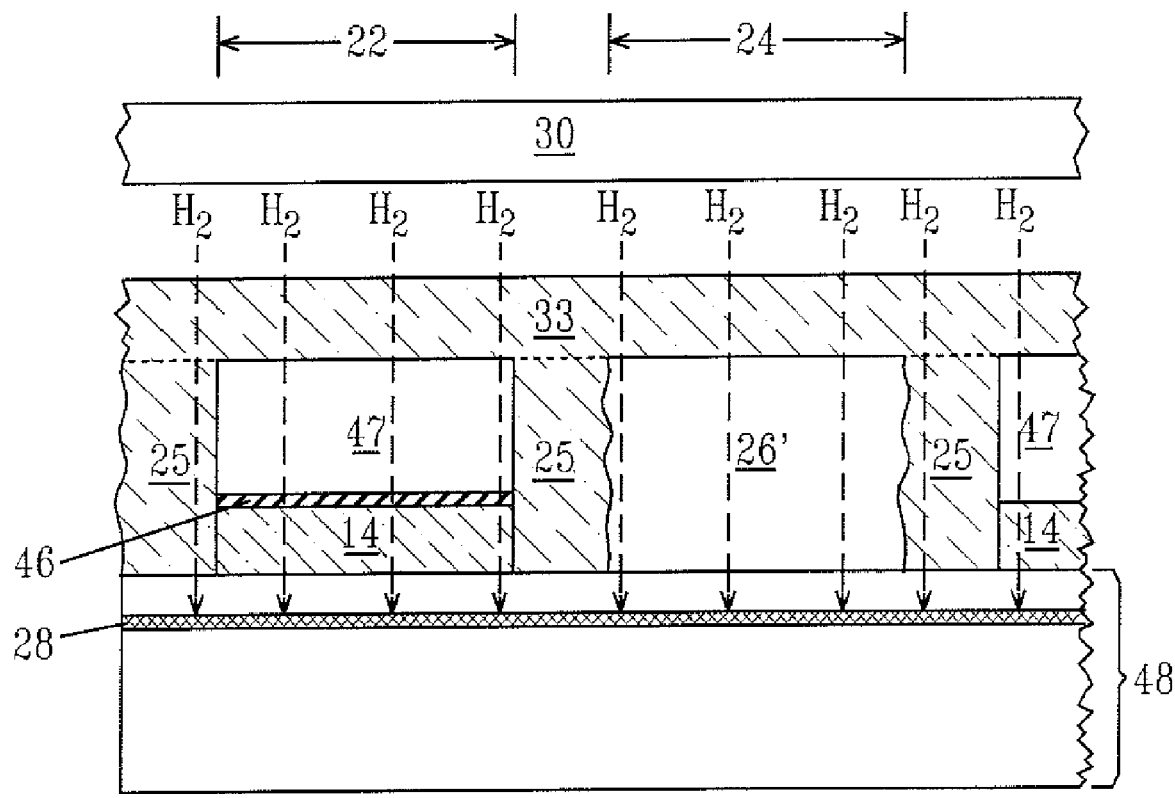
Figure 12:
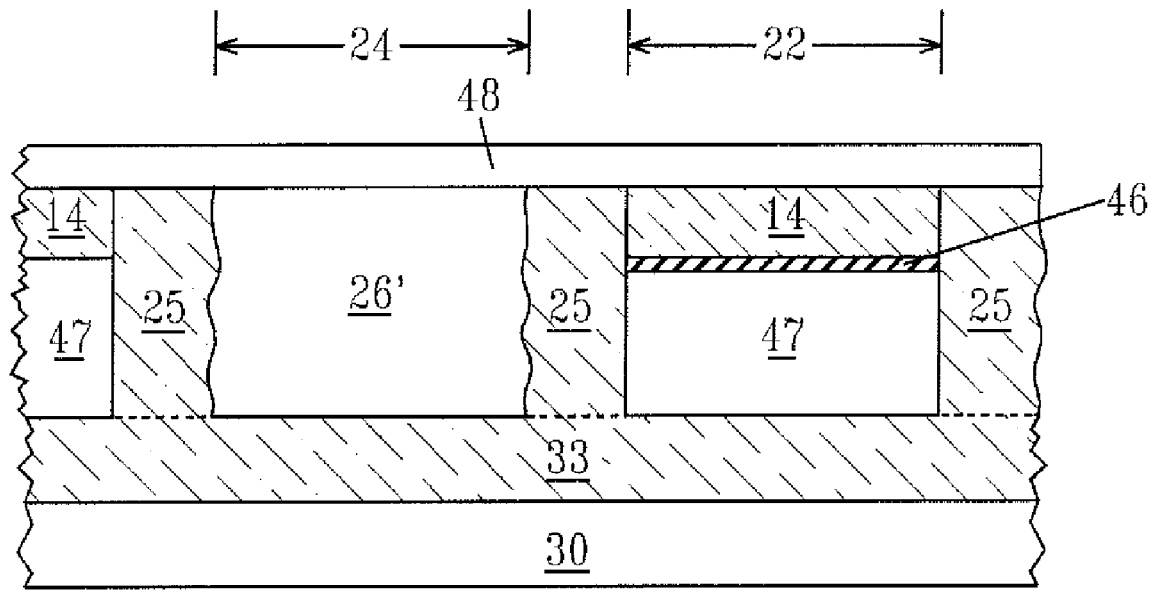
Figure 13:
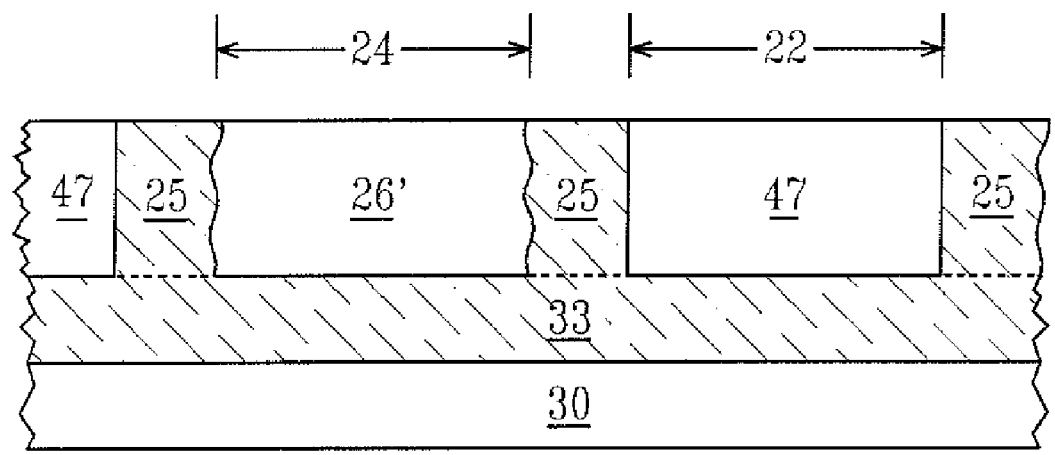

Referring to FIG. 11, in a next process step, a planar bonding layer 33 is formed using deposition and planarization atop the exposed surface of the layer of second orientation material 47, the oxidation layer 27, and the insulating material 25. A first substrate 30 is then bonded to the planar bonding layer 33 by conventional thermal bonding. The formation of the planar bonding layer 33 and bonding the planar bonding layer to the first substrate 30 are described in greater detail in the previous embodiment, as described with reference to FIG. 5. The first orientation material substrate 48 is then separated about the damaged interface 28, in which a remaining portion 48' of the first orientation material substrate remains, as depicted in FIG. 12.

The remaining portion 48 of the handling wafer is then subjected to a planarization process, such as chemical mechanical polishing (CMP) or grinding. The planarization process removes the remaining portion of the first orientation material substrate, layer of dielectric material 14, a portion of the insulating material 25, and the regrown portion of the first orientation material 26'. The planarization process ends on the second planarization stop layer 46.

In a next process step, a second thermal oxide layer is formed atop the exposed surface of the regrown portion of the first orientation material 26' so that the regrown portion of first orientation material 26' in the first region 24 has a surface substantially coplanar to the layer of second orientation material 47 in the second region 22. The second thermal oxide layer is formed by a thermal oxidation of Si process. The second thermal oxidation consumes Si from the exposed surface of the regrown portion of first orientation material 26', therefore leveling the upper surface of the regrown portion of first orientation material 26' in the first region 24 to the upper surface of the layer of second orientation material 47 in the second region 22. The second thermal oxide layer can have a thickness ranging from about 10 nm to about 15 nm, so long as the top surface of the regrown portion of first orientation material 26' is substantially coplanar to the top surface of the layer of second orientation material 47. Preferably, the second thermal oxide layer is $SiO_2$.

In a next process step, the second thermal oxide layer and the second planarization stop layer 46 are removed using a selective etching process, wherein the resulting structure comprises a substantially planar SOI substrate comprising a first region 24 having a first crystallographic orientation and a second region 22 having a second crystallographic orientation, the first crystallographic orientation being different from the second crystallographic orientation. The first region 24 and the second region 22 are separated by insulating material 25. Preferably, the first region has a (110) crystal plane and the second region has a (100) crystal plane.

Figure 14:
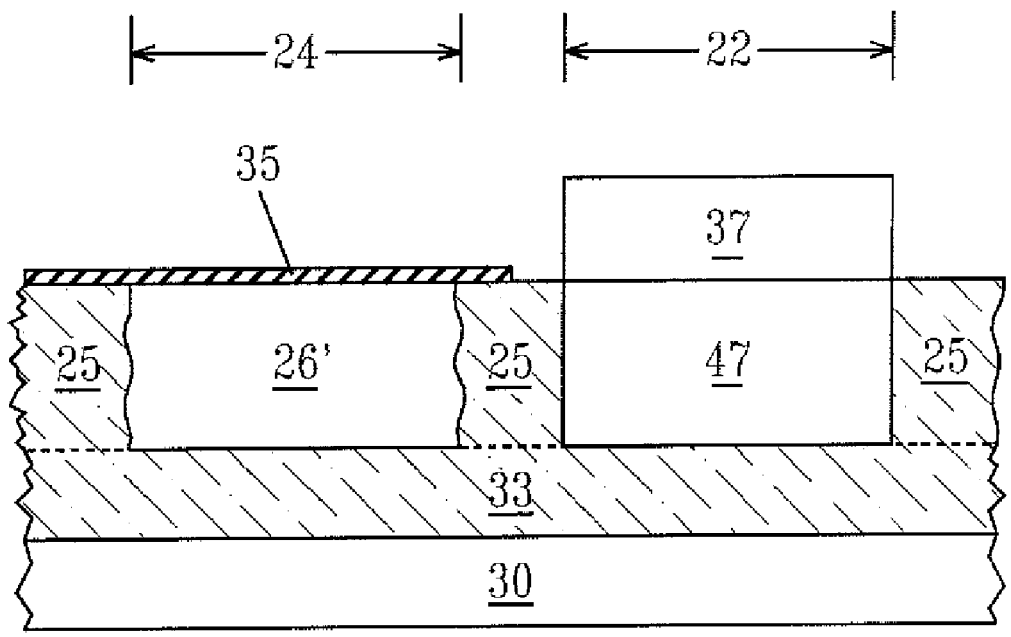

Referring to FIG. 14, a protective layer 35 is then formed atop the first device region 24 using deposition, photolithography and etching. The protective layer 35 comprises an insulating material, preferably a nitride material, such as $Si_3N_4$. The protective layer 35 may have a thickness ranging from about 10 nm to about 20 nm.

In a next process step, a second concentration of lattice modifying material 37 is grown atop the layer of second orientation material 47 in the second device region 22. The second concentration of lattice modifying material 37 may be SiGe formed by epitaxial growth. The second concentration of lattice modifying material 37 is preferably SiGe having a Ge concentration selected to produce the appropriate stress for a pFET device within the subsequently formed first strained semiconducting layer. Alternatively, the Ge concentration is selected to produce the appropriate stress for an nFET device within the subsequently formed first strained semiconducting layer.

Figure 15:
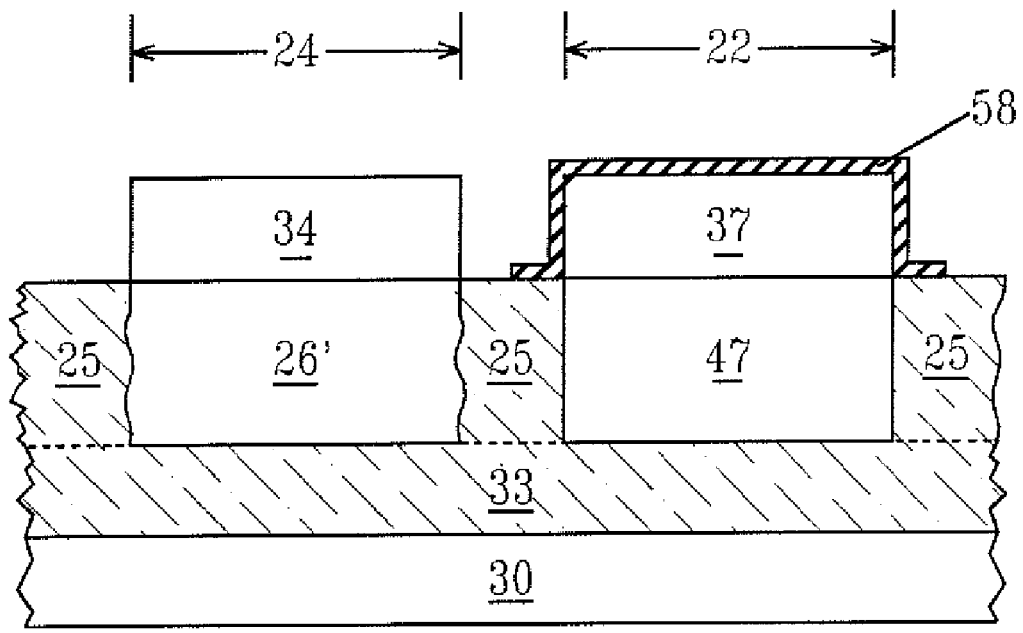

Referring to FIG. 15, the protective layer 35 is then removed by a highly selective etch that removes the protective liner 35 without substantially etching the second concentration of lattice modifying material 37, the regrown portion of first orientation material 26', or the insulating material 25. A protective liner 58 is then formed atop the second device region 22 including the second concentration of lattice modifying material 37 using deposition, photolithography, and etch processes, which are well known within the skill of the art. The protective liner 58 comprises an insulating material, preferably a nitride material, such as $Si_3N_4$, and may have a thickness ranging from about 10 nm to about 20 nm.

In a next process step, a first concentration of lattice modifying material 34 is grown atop the exposed surface of the regrown portion of first orientation material 26' in the first region 24 using a selective epitaxial growth process. The first concentration of lattice modifying material 34 is preferably SiGe having a Ge concentration selected to produce the appropriate stress for an nFET device within the subsequently formed first strained semiconducting layer 43. Alternatively, the Ge concentration is selected to produce the appropriate stress for a pFET device within the subsequently formed second strained semiconducting layer.

Figure 16:
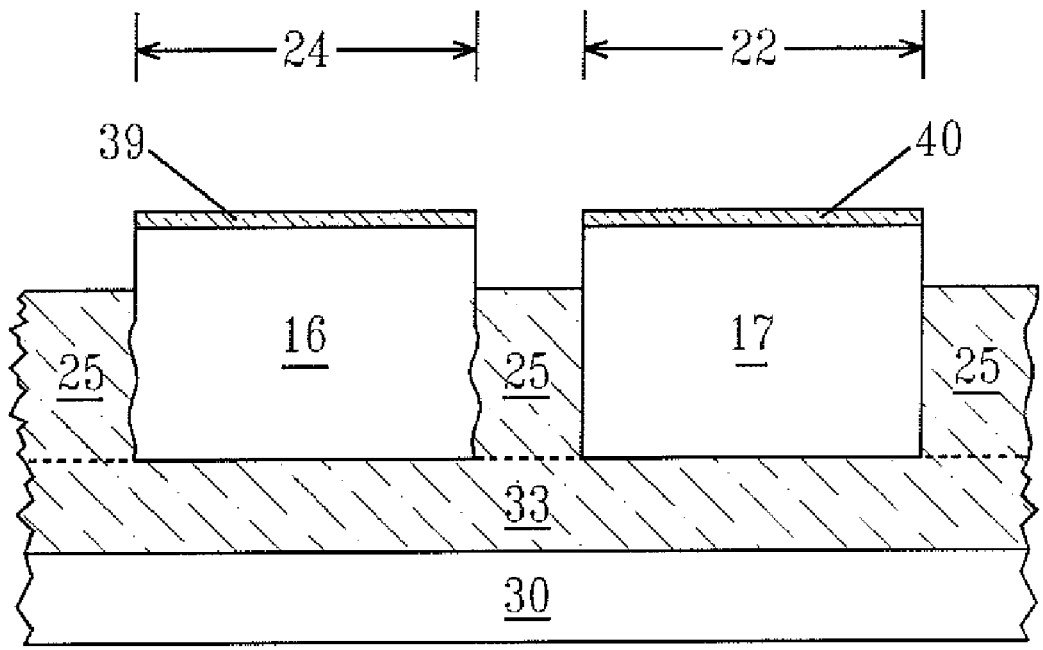

Referring now to FIG. 16, the structure is then annealed to intermix the first concentration of lattice modifying material 34 with the regrown portion of first orientation material 26' to form a first lattice dimension layer 16 and to intermix the second concentration of lattice modifying material 37 with the layer of second orientation material 47 to form a second lattice dimension layer 17. The annealing process is conducted in an oxidizing atmosphere to form a first thermal oxide 39 on the surface of the first region 24 and a second thermal oxide 40 on the surface of the second region 22. This annealing process may be conducted at a temperature ranging from about 1000° C. to about 1200° C. for a time period ranging from about 1 hour to 2 hours. Preferably, the first thermal oxide 39 and the second thermal oxide 40 comprise $SiO_2$ and have a thickness ranging from about 30 nm to about 100 nm.

During thermal oxidation of the first region 24 and the second region 22, the first thermal oxide 39 formed atop the first region 24 drives the Ge from the first concentration of lattice modifying material 34 into the regrown portion of first orientation material layer 26' and the second thermal oxide 40 drives the Ge from the second concentration of lattice modifying material 37 into the second orientation material layer 47.

The first lattice dimension layer 43 preferably has a lattice dimension that produces the appropriate strain for nFET device improvements in the subsequently formed first strained semiconductor layer, which is formed atop the first lattice dimension layer 43. The second lattice dimension layer 44 has a lattice dimension that produces the appropriate strain in the subsequently formed second strained semiconductor layer for optimized performance in pFET devices, in which the subsequently formed second strained semiconductor layer is epitaxially grown atop the second lattice dimension SiGe layer 42.

In the preferred embodiment, the first lattice dimension layer 17 has a different lattice dimension (also referred to as lattice constant) than the second lattice dimension layer 16. Alternatively, the first lattice dimension layer 17 can have the same lattice dimension as the second lattice dimension layer 16. The crystallographic orientation of the regrown semiconductor material 26' and the epitaxially grown first concentration of lattice modifying material 34 is maintained in the first lattice dimension layer 17. The crystallographic orientation of the first semiconductor layer having a second orientation material 47 and the epitaxially grown second concentration of lattice modifying material 37 is maintained in the second lattice dimension layer 16.

The first lattice dimension layer 17 preferably has a lattice dimension that produces the appropriate strain for pFET device improvements in the subsequently formed first strained semiconductor layer. The second lattice dimension layer 16 has a lattice dimension that produces the appropriate strain in the subsequently formed second strained semiconductor layer for optimized performance in nFET devices. The second lattice dimension material may be SiGe having a Ge concentration ranging from 5% to 40% and the first lattice dimension material may be SiGe having a Ge ranging from about 10% concentration to about 50%.

Figure 17:
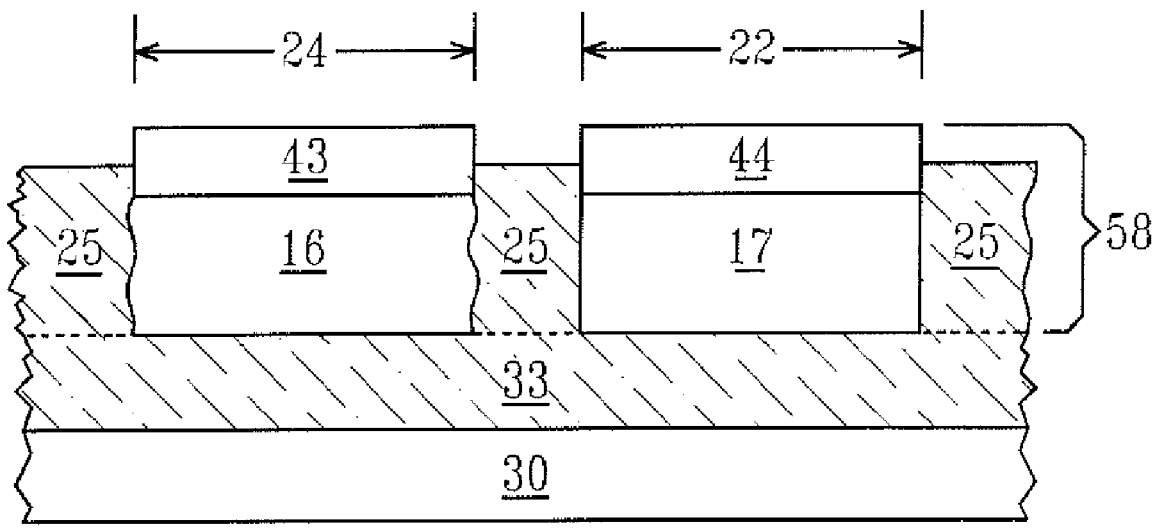

Referring to FIG. 17, the first thermal oxide 39 and the second thermal oxide 40 are then removed using a highly selective etch process to expose the first lattice dimension layer 17 and the second lattice dimension layer 16. Preferably, the highly selective etch process is a timed directional etch process, such as reactive ion etch, having a high selectivity for etching the first thermal oxide 39 and the second thermal oxide 40, without substantially etching the first lattice dimension layer 17 and the second lattice dimension layer 16.

In a next process step, the upper surface of the first lattice dimension layer 17 and the second lattice dimension layer 16 are recessed by a directional etch process, such as reactive ion etch (RIE). A first strained semiconducting layer 43 is then epitaxially grown atop the first lattice dimension SiGe layer 41 and a second strained semiconducting layer 44 is epitaxially grown atop the second lattice dimension SiGe layer 42. The first and second strained semiconducting layers 43, 44 comprise epitaxially formed Si. Similar to the previous embodiment, the first and second strained semiconducting layers 43, 44 comprise an internal tensile stress that results from the lattice mismatch between the smaller lattice dimension of epitaxially grown Si of the first and second semiconducting layers 43, 44 being formed atop the larger lattice dimension of the first and second lattice dimension layer 17, 16.

Preferably, the lattice mismatch between unstrained semiconducting layer 43 and the first lattice dimension layer 17 increases nFET performance and the lattice mismatch between the unstrained semiconducting layer 44 and the second lattice dimension layer 16 increases pFET performance. The strain produced in the first or second strained semiconducting layer 43, 44 is maintained so long as the first or second strained semiconducting layer 43, 44 is not grown to a thickness greater than its critical thickness.

In a preferred embodiment, the crystallographic orientation of the first strained semiconducting layer 43 is (100). Although a (100) crystal plane is preferred, the first strained semiconducting layer 43 may alternatively have a (111) crystal plane, a (110) crystal plane, or other crystal planes. Since the first strained semiconducting layer 43 is preferably in a (100) crystal plane, the crystallographic orientation of the second strained semiconducting layer 44 is in a (110) crystal plane. Although a (110) crystal plane is preferred, the second strained semiconducting layer 42 may alternatively have a (111) crystal plane, a (100) crystal plane or other crystal planes.

FIG. 17 depicts the layered structure produced following the formation of the first strained semiconducting layer 43 and the second strained semiconducting layer 44. The surface of the first strained semiconducting layer 43 and the second strained semiconducting layer 44 provide a multiple orientation surface layer 58 having a first region 24 and a second region 22 separated by spacers of insulating material 25, wherein the multiple orientation surface 58 is bonded to the first substrate 30 through the layer of dielectric material 33.

Figure 18:
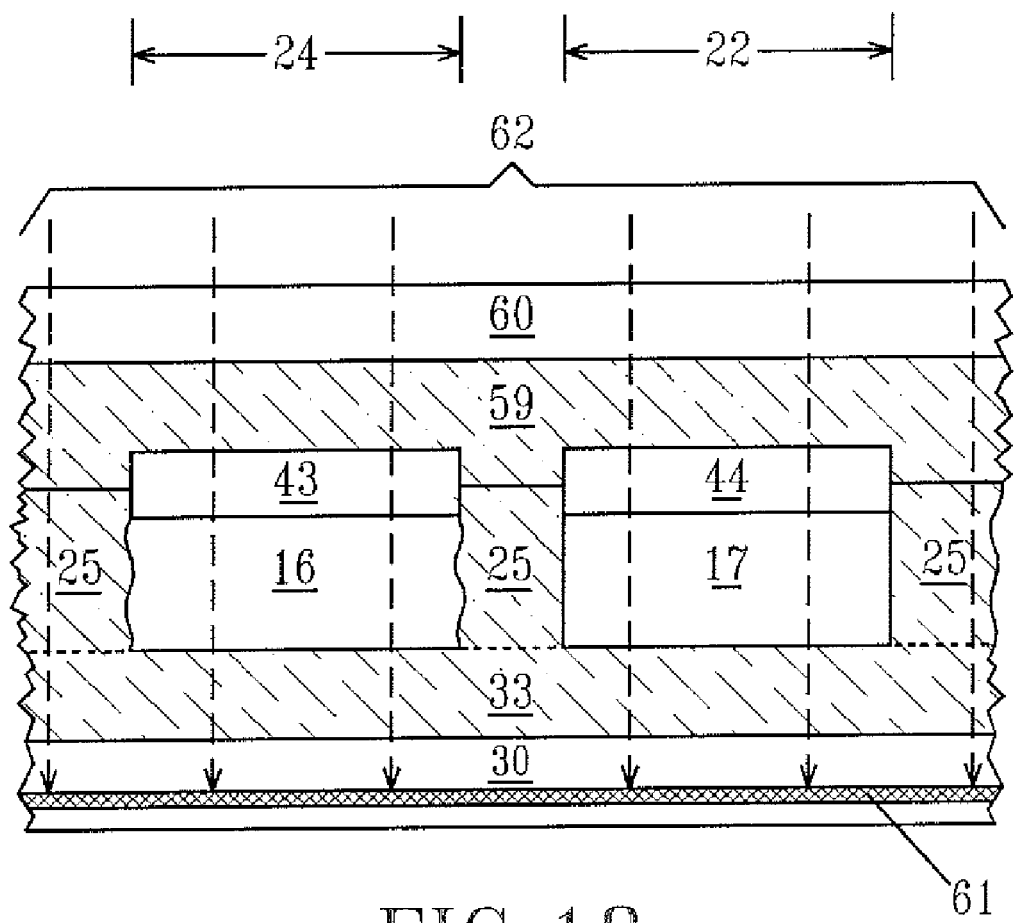

Referring to FIG. 18, following the formation of the first and second strained semiconducting layers 43, 44, a layer of insulating material 59 is blanket deposited atop the multiple orientation surface layer 58 and planarized using conventional planarization techniques, such as chemical mechanical polishing (CMP), to provide a planar bonding surface.

In a next process step, a second substrate 60 is thermally bonded to the planar bonding surface and a second damaged interface 61 is formed in the first substrate 30 by ion implantation 62. Similar to the previous embodiment depicted in FIG. 5, the second substrate 60 is bonded to the planar bonding surface 59 using thermal bonding and the second damaged interface 61 is formed by implanting hydrogen atoms into the first substrate 30. During thermal bonding of the second substrate 60 to the planar bonding surface 59 the first substrate 30 is split about the second damaged interface 61, wherein the portion of the first substrate 30 underlying the second damaged interface 61 is discarded and a damaged portion 30' of the first substrate remains.

The structure is then rotated 180 degrees and the damaged portion of the first substrate 30 is removed by a highly selective etch process having an etch chemistry that removes the damaged portion of the first substrate 30 without substantially etching the layer of insulating material 33. The layer of insulating material 33 is then removed to expose the first and second lattice dimension material 16, 17 by an etch process having an etch chemistry that removes the layer of insulating material 33 without substantially etching the first and second lattice dimension material 16, 17. This etch process may also recess the insulating material spacers 25. Alternatively, this etch process may also remove the first and second lattice dimension material 16, 17.

Figure 19:
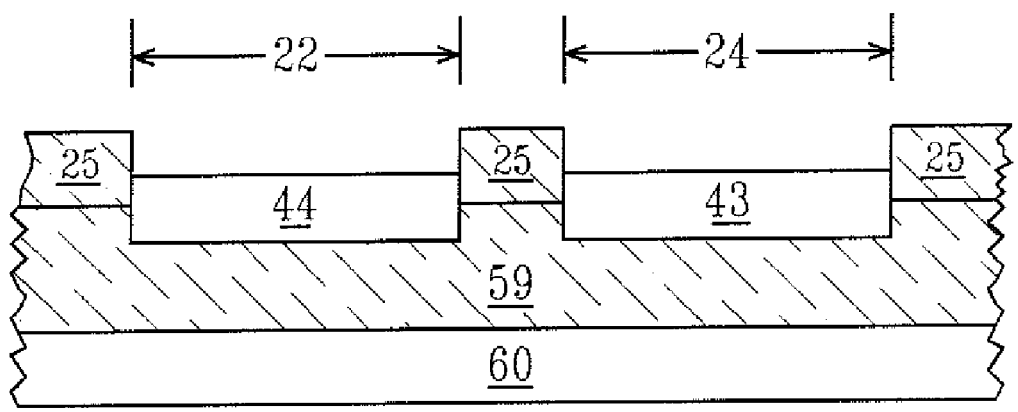

The first and second lattice dimension materials 16, 17 may then be removed to expose the first and second strained semiconducting layers 43, 44 by a highly selective etch process that removed the first and second lattice dimension 16, 17 materials without substantially etching the first and second strained semiconducting layers to provide a SSDOI substrate, as depicted in FIG. 19.

The exposed surfaces of the first strained semiconducting layer 43 and the second strained semiconducting layer 44 can then be processed to provide MOS devices. In a preferred embodiment the first strained semiconducting layer 43 comprises at least one nFET device 115 and the second strained semiconducting layer 44 comprises at least one pFET device 110.

While the present invention has been particularly shown and described with respect to preferred embodiments thereof, it will be understood by those skilled in the art that the foregoing and other changes in forms and details may be made with departing from the spirit and scope of the present invention. It is therefore intended that the present invention not be limited to the exact forms and details described and illustrated, but fall within the scope of the appended claims.

What is claimed is:

1. A semiconducting structure comprising:
   a substrate;
   an insulating layer atop said substrate; and
   a semiconducting layer positioned atop and in direct contact with said insulating layer, said semiconducting layer comprising a first strained Si region and a second strained Si region; wherein said first strained Si region has a crystallographic orientation different from said second strained Si region and said first strained Si region is laterally separated from said second strained Si region by an isolation region, said isolation region having an upper surface that is above an upper surface of either said first and second strained Si regions.

2. The semiconducting structure of claim 1, wherein said first strained Si region has an internal stress different from said second strained Si region.

3. The semiconducting structure of claim 1, wherein said first strained Si region has a crystallographic orientation in a (110) crystal plane and said second strained Si region has a crystallographic orientation in a (100) crystal plane.

4. The semiconducting structure of claim 3 further comprising at least one pFET device abutting said first strained Si region and at least one nFET device abutting said second strained Si region.

5. The semiconducting structure of claim 1 wherein said first strained Si region has a thickness ranging from about 10 nm to about 50 nm and said second strained Si region has a thickness ranging from about 10 nm to about 50 nm.

6. The semiconducting structure of claim 1 wherein said first strained Si region has a thickness equal to the thickness of the second strained Si region.

7. The semiconducting structure of claim 1 wherein said first strained Si region has a thickness different from said second strained Si region.

8. The semiconducting structure of claim 1, wherein said first strained Si region has a crystallographic orientation in a (100) crystal plane and said second strained Si region has a crystallographic orientation in a (110) crystal plane.

9. The semiconducting structure of claim 8 further comprising at least one nFET device abutting said first strained Si region and at least one pFET device abutting said second strained Si region.

* * * * *